United States Patent
Im

(10) Patent No.: US 11,605,747 B2
(45) Date of Patent: Mar. 14, 2023

(54) SOLAR ENERGY COLLECTOR ADAPTABLE TO VARIABLE FOCAL POINT

(71) Applicant: Do Sun Im, Norfolk, VA (US)

(72) Inventor: Do Sun Im, Norfolk, VA (US)

(*) Notice: Subject to any disclaimer, the term of this patent is extended or adjusted under 35 U.S.C. 154(b) by 75 days.

(21) Appl. No.: 16/575,192

(22) Filed: Sep. 18, 2019

(65) Prior Publication Data
US 2021/0083134 A1    Mar. 18, 2021

(51) Int. Cl.
*F24S 23/71* (2018.01)
*F24S 20/20* (2018.01)
*F24S 23/70* (2018.01)
*H01L 31/054* (2014.01)

(52) U.S. Cl.
CPC .......... *H01L 31/0543* (2014.12); *F24S 20/20* (2018.05); *F24S 23/71* (2018.05); *F24S 2023/86* (2018.05)

(58) Field of Classification Search
CPC .. F24S 30/20; F24S 23/30; F24S 23/31; F24S 10/74
See application file for complete search history.

(56) References Cited

U.S. PATENT DOCUMENTS

| | | | | |
|---|---|---|---|---|
| 3,991,741 A * | 11/1976 | Northrup, Jr. | .......... | F24S 50/20 126/578 |
| 4,058,110 A * | 11/1977 | Holt | ...................... | F24S 30/425 126/699 |
| 4,134,393 A * | 1/1979 | Stark | ...................... | F24S 23/31 126/581 |
| 4,238,246 A | 12/1980 | Genequand et al. | | |
| 4,440,155 A * | 4/1984 | Maloof | .................... | F24S 23/10 126/570 |
| 4,913,130 A * | 4/1990 | Inagaki | .................. | F24S 20/30 126/681 |
| 2011/0162637 A1 * | 7/2011 | Hahn | ...................... | F24S 25/00 126/689 |
| 2013/0291858 A1 * | 11/2013 | Lasich | .................... | F24S 80/60 126/676 |
| 2014/0020678 A1 * | 1/2014 | Krothapalli | ............. | F24S 50/20 126/714 |
| 2015/0090250 A1 * | 4/2015 | Im | .......................... | F24S 90/00 126/654 |
| 2015/0103427 A1 * | 4/2015 | Beck | ................... | H01L 31/0521 359/853 |
| 2015/0212188 A1 * | 7/2015 | Gross | .................... | G01S 3/7803 250/203.2 |
| 2016/0071993 A1 * | 3/2016 | McLain | .................. | F24S 30/20 136/246 |
| 2017/0097173 A1 * | 4/2017 | Mertins | ................... | F24S 23/70 |

(Continued)

FOREIGN PATENT DOCUMENTS

DE      2649792 A1    5/1978

*Primary Examiner* — Avinash A Savani
*Assistant Examiner* — Deepak A Deean
(74) *Attorney, Agent, or Firm* — Knobbe, Martens, Olson & Bear, LLP

(57) ABSTRACT

A solar energy collector includes: a solar energy collection tube having an absorption medium flow path for allowing an absorption medium to flow therethrough; a lens configured to concentrate solar energy on the solar energy collection tube; and an actuator configured to move the solar energy collection tube or the lens based on an incidence angle of the solar energy so that the solar energy is focused on the solar energy collection tube.

9 Claims, 11 Drawing Sheets

(56) References Cited

U.S. PATENT DOCUMENTS

| | | |
|---|---|---|
| 2019/0048859 A1 | 2/2019 | Im |
| 2019/0277539 A1* | 9/2019 | Sanchez Vega ........ F24S 50/20 |
| 2020/0191443 A1* | 6/2020 | Garvey .............. G02B 27/0983 |
| 2020/0212841 A1* | 7/2020 | Jain ......................... H02S 40/44 |

* cited by examiner

SOLAR ENERGY COLLECTOR ADAPTABLE TO VARIABLE FOCAL POINT

FIELD

The present disclosure relates to a solar energy collector adaptable to variable focal point.

BACKGROUND

Solar energy is the most abundant energy resource on the earth and may be defined as radiant energy (heat or light) emitted from the sun to the earth. Recently, photovoltaic system has been drawing attention in production of electric energy using such solar energy.

However, the photovoltaic system has low power generation efficiency and therefore has a disadvantage that sunlight collecting plates need to be installed in a wide range in order to generate the required power amount. Furthermore, the photovoltaic system cannot generate electricity when the sunlight is weak due to the cloud. Therefore, a "Solar Energy Collector (Korean Patent Publication No. 10-1052120)" has been proposed in which solar energy is concentrated by a lens into the solar energy collection tube.

However, the solar energy collector has a drawback that the energy absorbing efficiency through the solar energy collection tube may be lowered when the sunlight is not focused on the solar energy collection tube due to the change of the incidence angle of the sunlight.

SUMMARY

Embodiments of the present disclosure provide a solar energy collector adaptable to variable focal point, which is capable of effectively collecting solar energy in accordance with the incidence angle of solar energy.

In accordance with an aspect, there is provided a solar energy collector comprising: a solar energy collection tube having an absorption medium flow path for allowing an absorption medium to flow therethrough; a lens configured to concentrate solar energy on the solar energy collection tube; and an actuator configured to move the solar energy collection tube or the lens based on an incidence angle of the solar energy so that the solar energy is focused on the solar energy collection tube.

The actuator may be configured to adjust the distance between the solar energy collection tube and the lens by moving one of the solar energy collection tube and the lens relative to the other.

The actuator may be configured to move the solar energy collection tube toward or away from the lens so that the solar energy is focused on the solar energy collection tube.

The lens may have a flat panel shape.

The solar energy collector may further comprise: a controller configured to control the actuator so that the solar energy is focused on the solar energy collection tube based on incidence angle information including incidence angles of the solar energy that vary with time.

The solar energy collector may further comprise: a sensor configured to measure an incidence angle of the solar energy; and a controller configured to control the actuator so that the solar energy is focused on the solar energy collection tube by using the incidence angle measured by the sensor.

The solar energy collector may further comprise: a lens tilting unit configured to adjust an arrangement angle of the lens so that the lens is arranged to face an incidence direction of the solar energy.

The solar energy collector may further comprise: a solar energy collection tube tilting unit configured to adjust an arrangement angle of the solar energy collection tube so that a side surface of the solar energy collection tube is disposed to face an incidence direction of the solar energy.

The lens may be configured to concentrate the solar energy toward the center in the solar energy collection tube, the lens extending along a longitudinal direction of the solar energy collection tube.

The solar energy collection tube may comprise: a heat collection body portion including a heat collecting part that transmits the solar energy into the solar energy collection tube; and a heat insulating portion provided to cover at least a part of a remaining part of the heat collection body portion other than the heat collecting part.

The solar energy collection tube may comprise: a heat collection body portion configured to provide the absorption medium flow path, the heat collection body portion having an arc-shaped cross section; a heat insulating portion covering the heat collecting portion; and a heat collecting window portion connected to the heat collecting portion, the heat collecting window portion transmitting the solar energy therethrough, wherein the heat collecting window portion has an arc-shaped cross section whose radius of curvature is the same as a radius of curvature of the heat collection body portion.

In accordance with another aspect, there is provided a solar energy collector comprising: a solar energy collection tube having an absorption medium flow path for allowing an absorption medium to flow therethrough; a reflector configured to concentrate solar energy on the solar energy collection tube; and an actuator configured to move the solar energy collection tube or the reflector based on an incidence angle of the solar energy so that the solar energy is focused on the solar energy collection tube.

The actuator may be configured to adjust the distance between the solar energy collection tube and the reflector by moving one of the solar energy collection tube and the reflector relative to the other.

The actuator may be configured to move the solar energy collection tube toward or away from the reflector so that the solar energy is focused on the solar energy collection tube.

With such configurations, it is possible to effectively collect solar energy through the solar energy collection tube by moving the solar energy collection tube or the lens so that the solar energy is focused on the solar energy collection tube. This makes it possible to stably supply heat required for solar power generation.

DETAILED DESCRIPTION OF THE EMBODIMENTS

Figure 1:
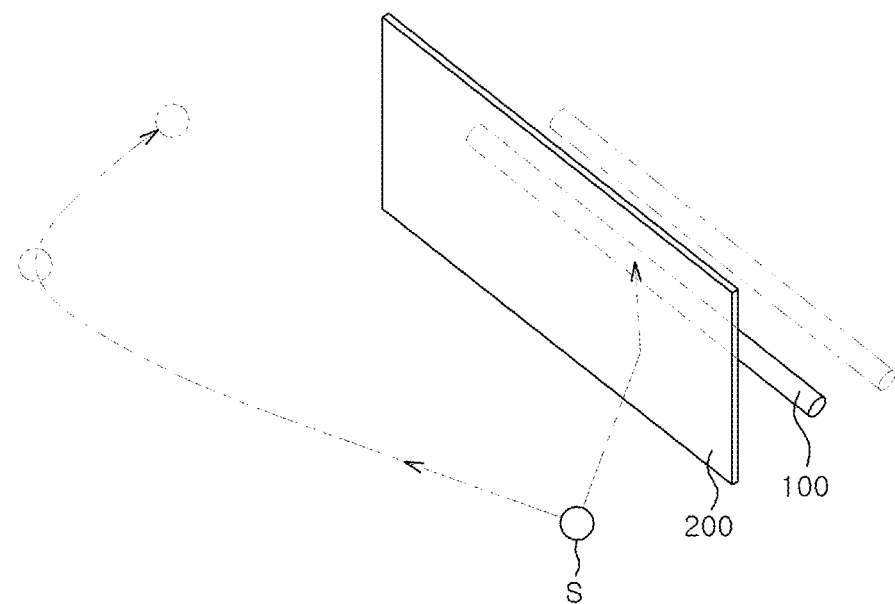
FIG. 1 is a perspective view showing a solar energy collector according to a first embodiment.
Figure 2:
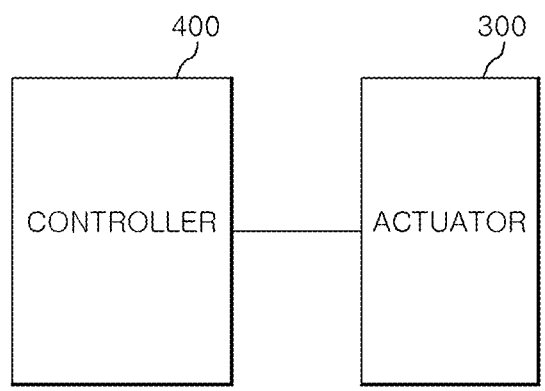
FIG. 2 is a diagram showing a control configuration of the solar energy collector according to the first embodiment.

Hereinafter, configurations and operations of embodiments will be described in detail with reference to the accompanying drawings. The following description is one of various patentable aspects of the invention and may form a part of the detailed description of the invention.

However, in describing the invention, detailed descriptions of known configurations or functions that make the invention obscure may be omitted.

The invention may be variously modified and may include various embodiments. Specific embodiments will be exemplarily illustrated in the drawings and described in the detailed description of the embodiments. However, it should be understood that they are not intended to limit the invention to specific embodiments but rather to cover all modifications, similarities, and alternatives which are included in the spirit and scope of the invention.

The terms used herein, including ordinal numbers such as "first" and "second" may be used to describe, and not to limit, various components. The terms simply distinguish the components from one another. When it is said that a component is "connected" "coupled" or "linked" to another component, it should be understood that the former component may be directly connected or linked to the latter component or a third component may be interposed between the two components. Specific terms used in the present application are used simply to describe specific embodiments without limiting the invention. An expression used in the singular encompasses the expression of the plural, unless it has a clearly different meaning in the context.

As shown in FIGS. 1 to 8, a solar energy collector according to a first embodiment includes the solar energy collection tube 100 having a hollow tubular shape, a lens 200 for concentrating the solar energy on the solar energy collection tube 100, an actuator 300 and a controller 400.

The solar energy collection tube 100 has a tubular shape extending in one direction.

Specifically, the solar energy collection tube 100 is provided in the form of a tube having an annular cross section. However, the present disclosure is not limited thereto, and the solar energy collection tube 100 may have various cross-sectional shapes. For example, the solar energy collection tube 100 may have an elliptical ring-shaped cross section or a polygonal ring-shaped cross section.

The solar energy collection tube 100 may be made of a material having high heat conductivity or a material capable of allowing solar energy to pass therethrough. As an example, the solar energy collection tube 100 may be made of a material having high heat conductivity, such as aluminum, copper or an alloy thereof, or a material capable of effectively allowing solar energy to pass therethrough, such as glass, quartz, transparent plastic or the like.

Figure 8:
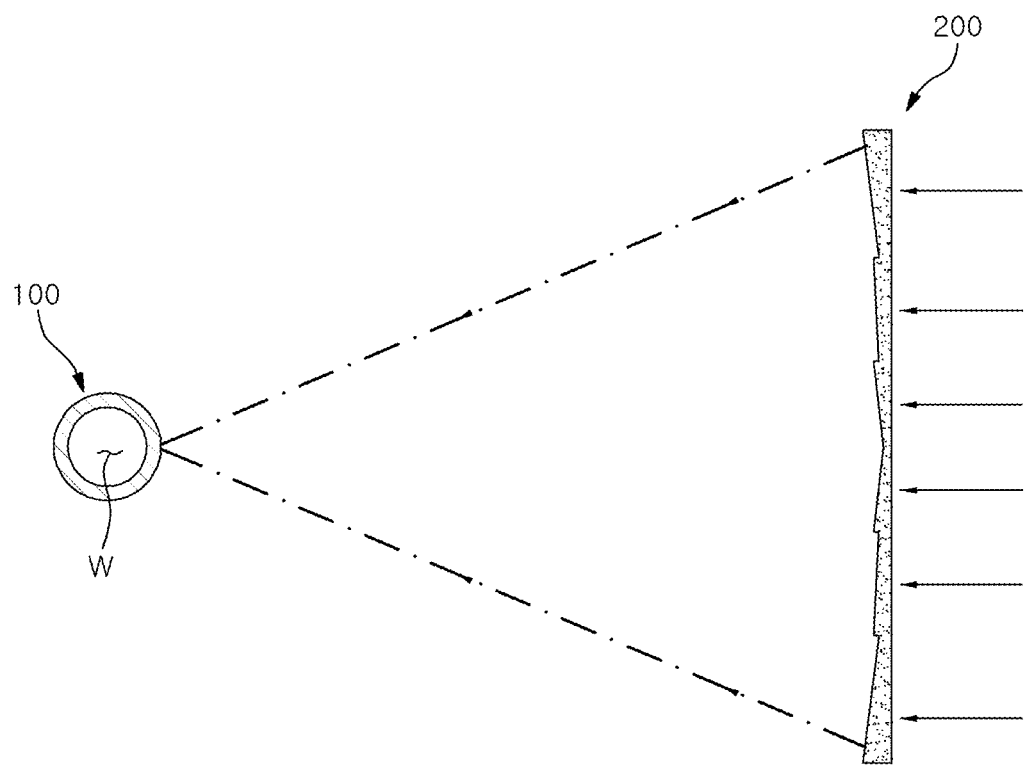
FIG. 8 is a sectional view showing the solar energy collection tube of the solar energy collector according to the first embodiment.

As shown in FIG. 8, an absorption medium flow path W through which an energy absorption medium can flow is provided inside the solar energy collection tube 100. The absorption medium flow path W is formed to extend in the longitudinal direction (one direction) of the solar energy collection tube 100.

The energy absorption medium flows along the longitudinal direction in the absorption medium flow path W. Furthermore, the energy absorption medium may be heated by the solar energy incident on the solar energy collection tube 100 through the lens 200 while the energy absorption medium flows through the absorption medium flow path W.

In this regard, the energy absorption medium includes all kinds of fluid capable of absorbing solar energy (solar radiant heat) and is movable along the absorption medium flow path W. For example, the energy absorption medium may be air, a volatile fluid (methanol, acetone, mercury, etc.), water (including water vapor), oil, an ethylene glycol mixture, and the like.

The energy absorption medium heated in the absorption medium flow path W is moved toward a thermal energy utilizing apparatus (not shown) such as a generator or the like. The energy absorption medium moved to the generator is used as a heat source of the generator for the generation of electricity.

The lens 200 has a flat panel shape extending along the longitudinal direction of the solar energy collection tube 100. The lens 200 is disposed parallel to the longitudinal axis passing through the center in the solar energy collection tube 100. The lens 200 is formed longer in the width direction than the solar energy collection tube 100 for efficiently collecting solar energy.

In one example, the lens 200 includes a plurality of Fresnel lenses 200 whose focal line passes through between the center and the edge thereof. The term "focal line" may be defined as a path of light passing through a focal point of the lens 200 without being refracted. That is to say, the focal line refers to a path passing through the focal point of the lens 200 in a direction perpendicular to the lens 200.

The Fresnel lenses 200 are arranged to form a flat panel. Although the lens 200 includes the plurality of Fresnel lenses 200 in the present embodiment, the present disclosure is not limited thereto. The lens 200 has a convex shape in a transverse section perpendicular to the longitudinal direction.

The lens 200 can refract the solar energy (sunlight) to be directed toward the center in the solar energy collection tube 100. The lens 200 can be moved by actuator 300 to allow the sunlight to be accurately focused on the solar energy collection tube 100.

The actuator 300 can relatively move one of the solar energy collection tube 100 and the lens 200 with respect to the other so that the solar energy is focused on the solar energy collection tube 100. For example, when the lens 200 is in a fixed state, the actuator 300 may move the solar energy collection tube 100 toward or away from the lens 200 so that the sunlight is focused on the solar energy collection tube 100. When the solar energy collection tube 100 is in a fixed state, the actuator 300 can move the lens 200 toward or away from the solar energy collection tube 100 so that the sunlight is focused on the solar energy collection tube 100. Further, the actuator 300 may move both the solar energy collection tube 100 and the lens 200 to focus the sunlight on the solar energy collection tube 100.

The actuator 300 can relatively move one of the solar energy collection tube 100 and the lens 200 with respect to the other to keep the solar energy collection tube 100 and the lens 200 in parallel. In other words, even when the solar energy collection tube 100 or the lens 200 is relatively moved by the actuator 300, the distance between one ends of the solar energy collection tube 100 and the lens 200 and the distance between the other ends of the solar energy collection tube 100 and the lens 200 can be kept to be same.

Figure 3:
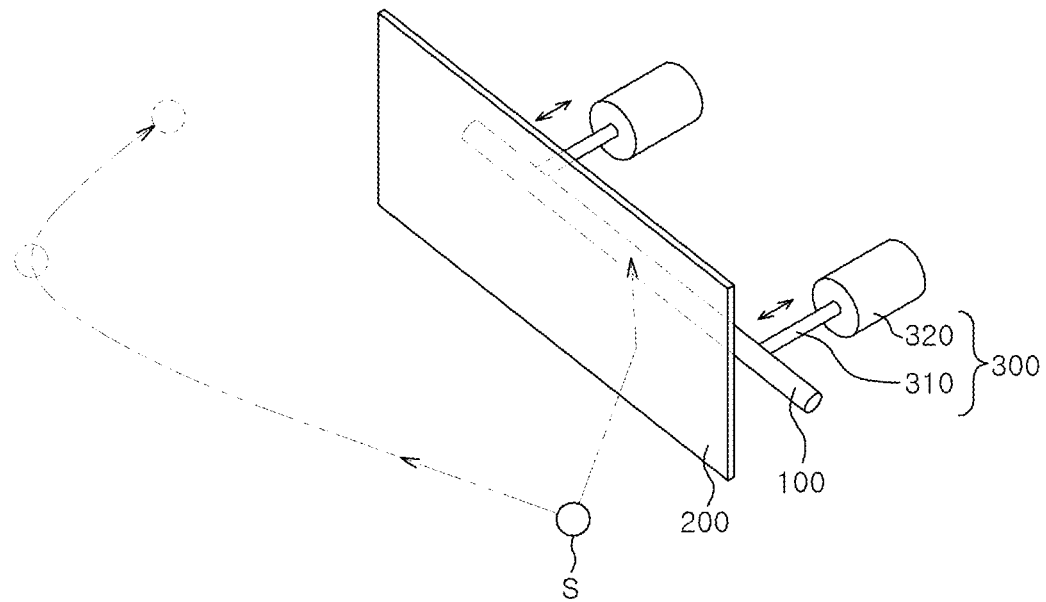
FIG. 3 is a perspective view showing an actuator including a driving arm and a driving cylinder of the solar energy collector according to the first embodiment.

As shown in FIG. 3, the actuator 300 including a drive arm 310 and a drive cylinder 320 supports both end portions of the solar energy collection tube 100 or the lens 200. The distances between both ends of the solar energy collection tube 100 and the lens 200 can be kept to be the same by the expansion and contraction action of the driving arm 310 when the driving arms 310 are expanded and contracted by the same length by the operations of the driving cylinders 320. When the drive arm 310 located at one end of the solar energy collection tube 100 and the drive arm 310 located at the other end of the solar energy collection tube 100 are expanded and contracted differently in length, the distances between both ends of the solar energy collection tube 100 and the lens 200 may be different from each other.

Figure 4:
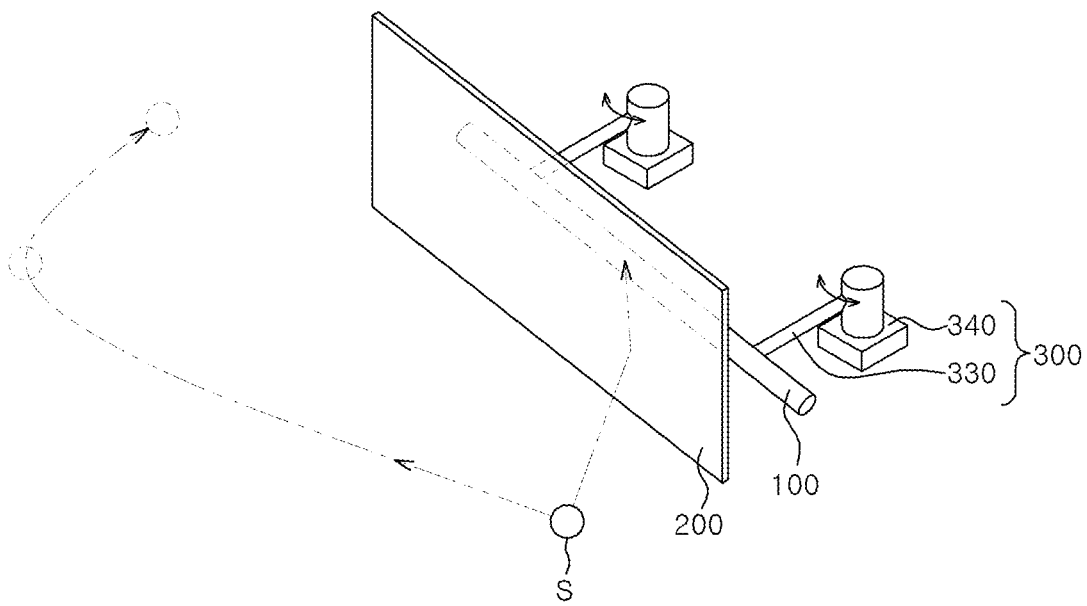
FIG. 4 is a perspective view showing an actuator including a pivot arm and a rotating motor in a solar energy collector according to a modification of the first embodiment.

As shown in FIG. 4, an actuator 300 according to a modification of the first embodiment may include a pivot arm 330 for supporting both end portions of the solar energy collection tube 100, and a rotary motor 340 for rotating the pivot arm 330.

Although the actuator 300 supporting both end portions of the solar energy collection tube 100 is disposed on the opposite side of the lens 200 with respect to the solar energy collection tube 100 as shown in FIG. 4, the present disclosure is not limited thereto. The actuator 300 may be disposed between the solar energy collection tube 100 and the lens 200.

When the pivot arms 330 are rotated by the operations of the respective rotation motors 340, the rotation operations of the pivot arms 330 cause the solar energy collection tube 100 to be translated such that the distances between the both ends of the solar energy collection tube 100 and the lens 200 are kept the same.

Accordingly, the actuator 300 can move the solar energy collection tube 100 toward or away from the lens 200 so that the sunlight is focused on the solar energy collection tube 100.

Figure 5:
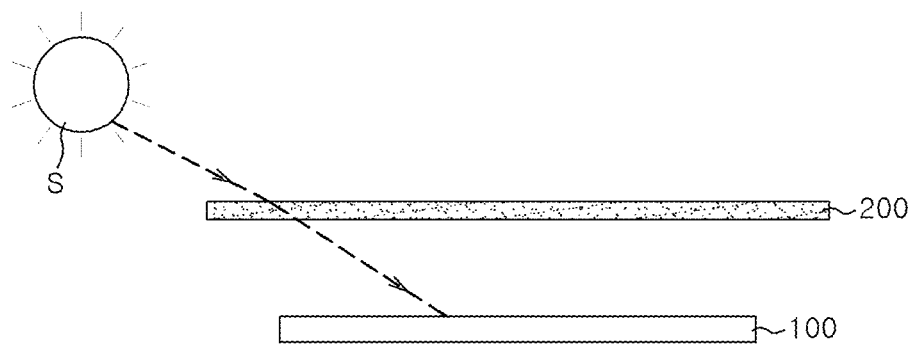
FIG. 5 is a plan view showing the solar energy collector according to the first embodiment when the sun is in the east in the morning.

For example, as shown in FIG. 5, in the morning when the sun is located on the east side, the actuators 300 can position the solar energy collection tube 100 in parallel with the lens 200 so that the sunlight is focused on the solar energy collection tube 100.

Figure 6:
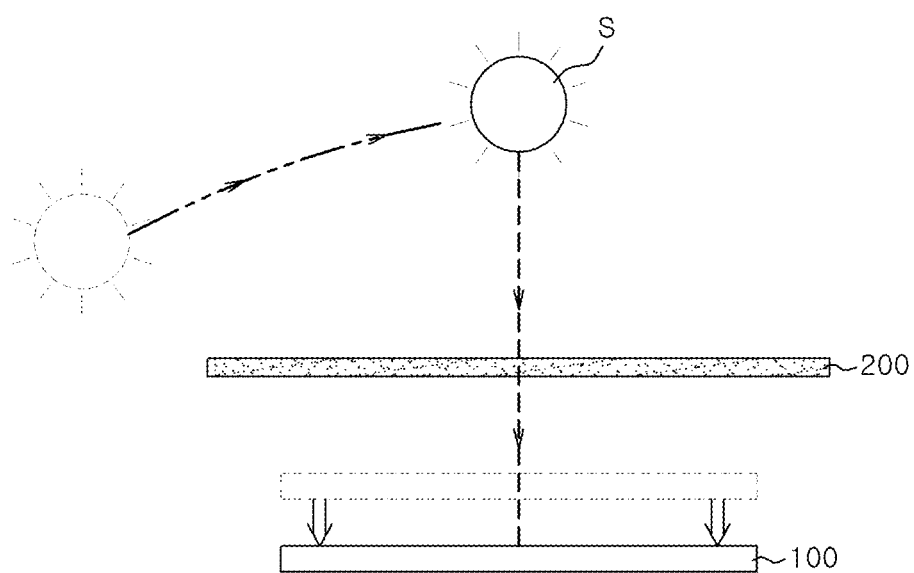
FIG. 6 is a plan view showing the solar energy collector according to the first embodiment when the sun is in the south at noon.

As shown in FIG. 6, at solar noon when the sun is located on the south in northern hemisphere, the actuators 300 can move the solar energy collection tube 100 away from the lens 200 so that the sunlight is focused on the solar energy collection tube 100.

Figure 7:
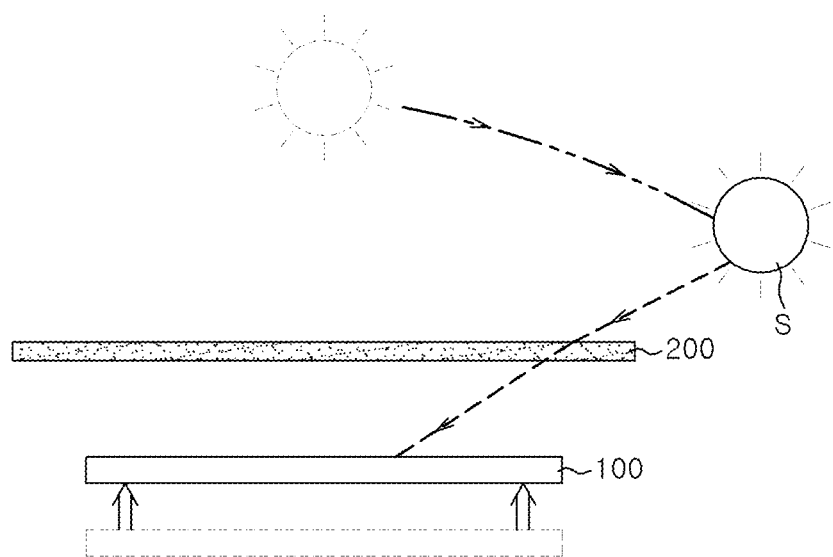
FIG. 7 is a plan view showing the solar energy collector according to the first embodiment when the sun is in the west in afternoon.

As shown in FIG. 7, when the sun is located on the west side in the afternoon, the actuators 300 can move the solar energy collection tube 100 to be closer to the lens 200 so that the sunlight is focused on the solar energy collection tube 100.

As described above, the actuator 300 can move the solar energy collection tube 100 toward or away from the lens 200 so that the sunlight is focused on the solar energy collection tube 100 even when the solar energy focal point of the lens 200 varies depending on the location of the sun.

The controller 400 controls the actuators 300 so that the sunlight is focused on the solar energy collection tube 100. The controller 400 controls the actuators 300 to move the solar energy collection tube 100 or the lens 200 relative to each other in accordance with a predetermined program. For example, the incident angles of the sunlight depending on the season and time may be input to the controller 400 in advance, and the controller 400 may control the actuators 300 based on the input incident angles of the sunlight so that the sunlight is focused on the solar energy collection tube 100.

The controller 400 may be implemented by an operation device including a microprocessor, a memory, and the like. The implementation method thereof is obvious to those skilled in the art and the detailed description thereof will be omitted.

Figure 9:
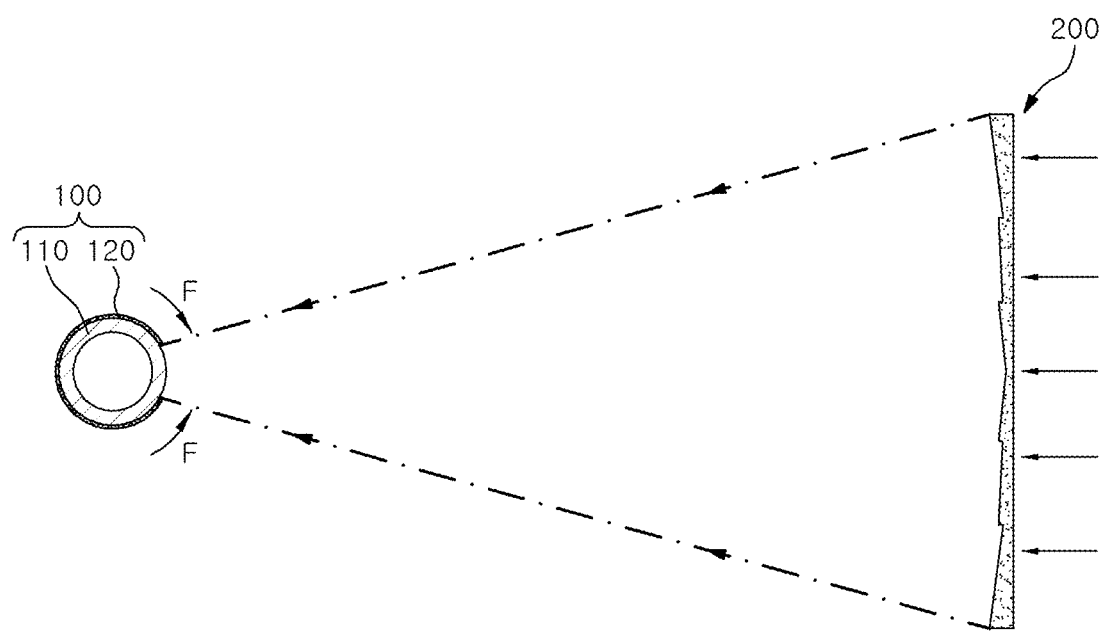
FIG. 9 is a sectional view showing the solar energy collection tube of a solar energy collector according to a modification of the first embodiment.

As shown in FIG. 9, the solar energy collection tube 100 according to a modification of the first embodiment includes a heat collection body portion 110 and a heat insulating portion 120. Hereinafter, the modification of the first embodiment will be described with reference to the differences from the solar energy collection tube 100 of the first embodiment described above, and the same configurations will be given the same reference numerals and the redundant description thereof will be omitted.

The heat collecting body portion 110 includes a heat collecting part F that transmits solar energy concentrated by the lens 200 into the solar energy collection tube 100, and a remaining part other than the heat collecting part F. The heat insulating portion 120 is provided to cover the remaining part of the heat collection b portion 110 to minimize leakage of heat. The heat insulating portion 120 may be provided to cover a part of the remaining part of the heat collecting body portion 110.

Accordingly, the solar energy collection tube 100 can receive solar energy concentrated by the lens 200 through the heat collecting part F, and the heat insulating port 120 prevents the solar energy transmitted into the solar energy collection tube 100 from being discharged to the outside of the solar energy collection tube 100. In other words, the heat insulating portion 120 can minim the heat loss in the solar energy collection tube 100.

The heat collection body portion 110 may be formed of a material having a high thermal conductivity. For example, the heat collection body portion 110 may be formed of aluminum, copper or an alloy thereof, which has a high thermal conductivity. The material of the heat collection body portion 110 may be selected in consideration of cost, strength, insulation and corrosion resistance at the maximum expected temperature in the solar energy collection tube 100. Further, the heat collection body portion 110 may be formed in an arc-like shape or a circular shape in cross section with a predetermined radius of curvature.

The heat insulating portion 120 is arranged to surround the remaining part of the heat collection body portion 110 except for the heat collecting part F for heat insulation thereof. The insulating portion 120 may be a member such as a film detachably attached to the heat collection body portion 110 and may be a coating layer integrally formed on the surface of the heat collection body portion 110 by vapor deposition.

For example, the heat collection body portion 110 may be formed of a heat insulation material such as an urethane insulation material, a spring metal insulation material, a vinyl insulation material, a foamed rubber insulation material, a polystyrene insulation material (foamed sponge), an insulation film and the like. In addition, various kinds of materials for heat insulation may be used as the material of the heat insulating portion 120.

Figure 10:
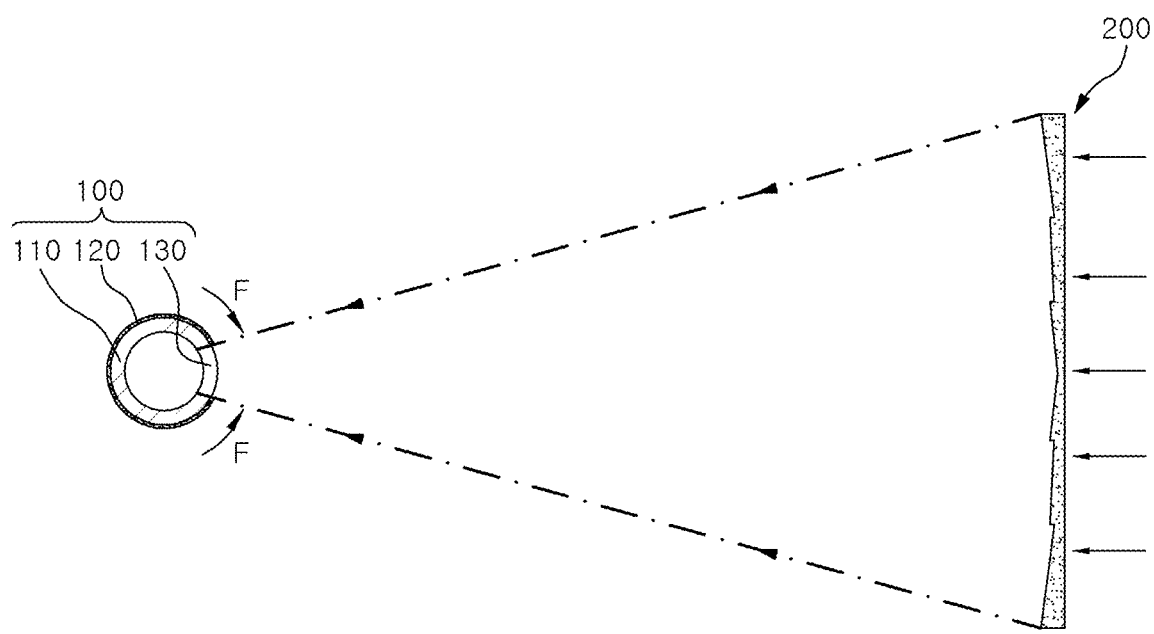
FIG. 10 is a sectional view showing the solar energy collection tube of a solar energy collector according to another modification of the first embodiment.

As shown FIG. 10, the solar energy collection tube 100 according to another modification of the first embodiment may include a heat collection body portion 110, a heat insulating portion 120, and a heat collecting window portion 130.

The heat collection body portion 110 has a shape corresponding to a part of a cylinder. The heat collection body portion 110 has an arc-shaped cross section. The heat collecting window portion 130 has a shape corresponding to the remaining part of the cylinder. The heat collecting window portion 130 may have an arc-shaped cross section. The heat collecting window portion 130 is connected to the heat collection body portion 110 and the heat insulating portion 120.

The heat collecting window portion 130 is disposed in the heat collecting part F to which solar energy is intensively irradiated. The heat collecting window portion 130 is formed to transmit solar energy therethrough. For example, the heat collecting window portion 130 may be a one-way window that permits radiant heat transfer only in one direction in which solar energy is incident, and that prevents radiant heat transfer in the opposite direction to the one direction. The heat collecting window portion 130 has an arc shape such that its cross section has a radius of curvature substantially the same as the radius of curvature of the heat collection body portion 110. However, the present disclosure is not limited to the above, and the heat collecting window 130 may have a flat shape.

In the present embodiment, the heat collecting window portion is constituted by a polarizing glass capable of transmitting solar energy, for example. Alternatively, the heat collecting window portion 130 may be formed of a polarizing film or a polarizing plastic capable of allowing radiant heat transfer only in one direction in which solar energy is incident.

Figure 11:
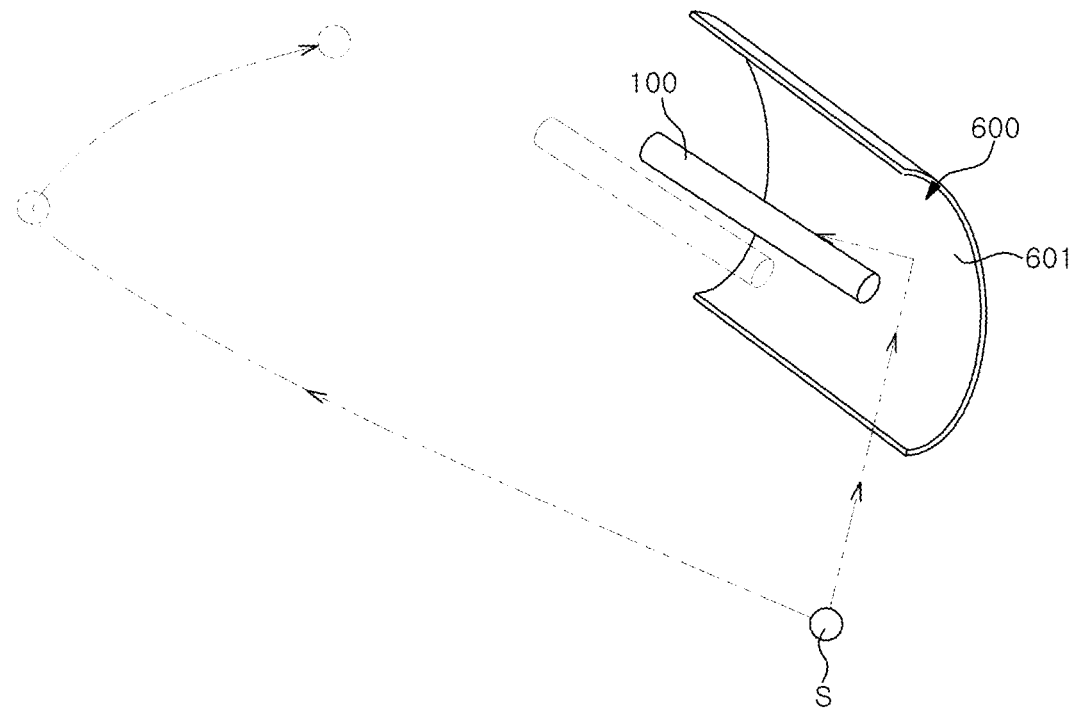
FIG. 11 is a perspective view showing a solar energy collector according to a second embodiment.
Figure 12:
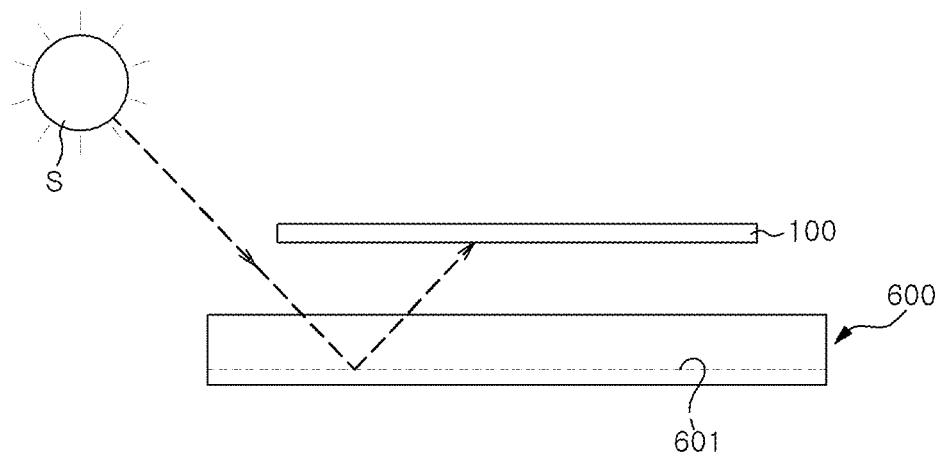
FIG. 12 is a plan view showing the solar energy collector according to the second embodiment when the sun is in the east in the morning.
Figure 13:
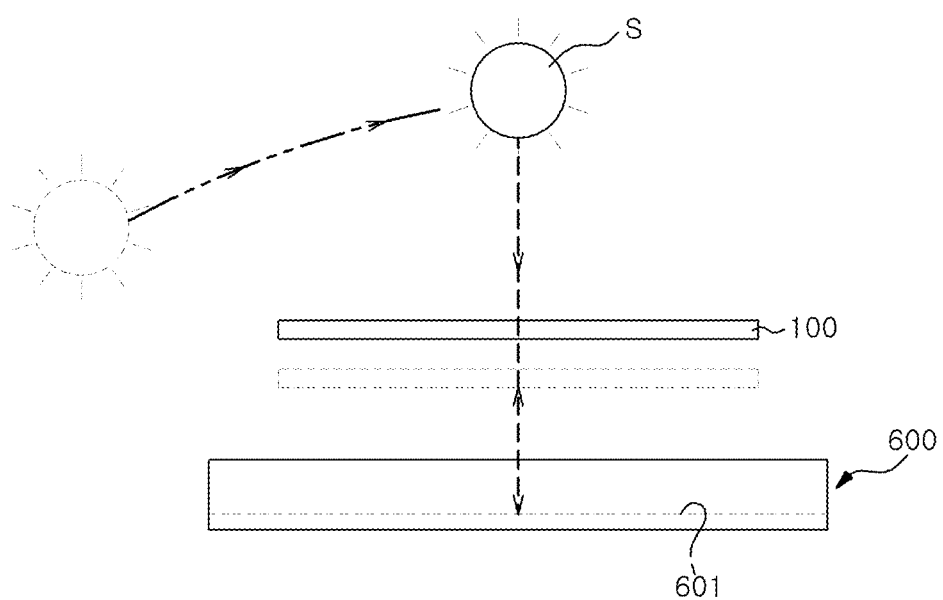
FIG. 13 is a plan view showing the solar energy collector according to the second embodiment when the sun is in the south at noon.

As shown in FIGS. 11 to 13, a solar energy collector according to a second embodiment of the present disclosure includes a solar energy collection tube 100, a reflector 600, an actuator 300, and a controller 400.

Specifically, the reflector 600 is formed in a curved plate having a reflecting surface 601. The solar energy collection tube 100 is located on the front side of the reflecting surface 601 of the reflector 600 so that the solar energy reflected by the reflector 600 is focused thereto.

The configurations of the solar energy collection tube 100 and the reflector 600 correspond to those of the lens 200 and the solar energy collection tube 100 described with reference to the first embodiment, and a detailed description thereof will be omitted. However, since the lens 200 is provided as the curved reflector 600, the solar energy collection tube 100 may be positioned at a focusing point of the reflecting surface 601 of the reflector 600.

In addition, the actuator 300 can relatively move the solar energy collection tube 100 or the reflector 600 based on the incidence angle of the solar energy so that the solar energy is focused on the solar energy collection tube 100. For example, as shown in FIG. 12, when the sun is located on the east side, the actuator 300 can position the solar energy collection tube 100 in parallel with the reflector 600 so that the sunlight is focused on the solar energy collection tube 100.

As shown in FIG. 13, at noon when the sun is located on the south side, the actuators 300 can move the solar energy collection tube 100 away from the reflector 600 so that the sunlight is focused on the solar energy collection tube 100.

Figure 14:
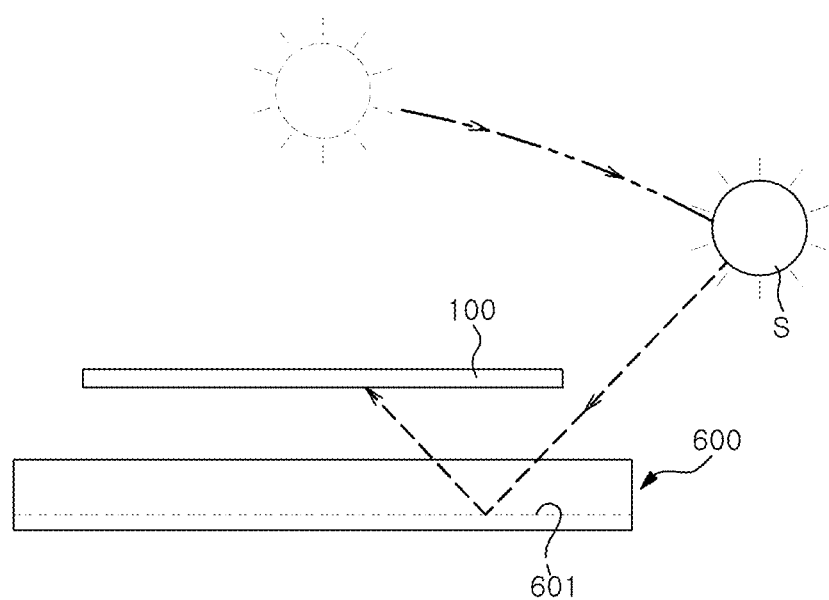
FIG. 14 is a plan view showing the solar energy collector according to the second embodiment when the sun is in the west in the afternoon.

As shown in FIG. 14, when the sun is located on the west side in the afternoon, actuators 300 can move the solar energy collection tube 100 to be closer to the reflector 600 so that the sunlight is focused on the solar energy collection tube 100.

As described above, the actuator 300 can move the solar energy collection tube 100 toward or away from the reflector 600 so that the sunlight is focused on the solar energy collection tube 100 even when the solar energy focal point of the reflector 600 varies depending on the location of the sun.

Figure 15:
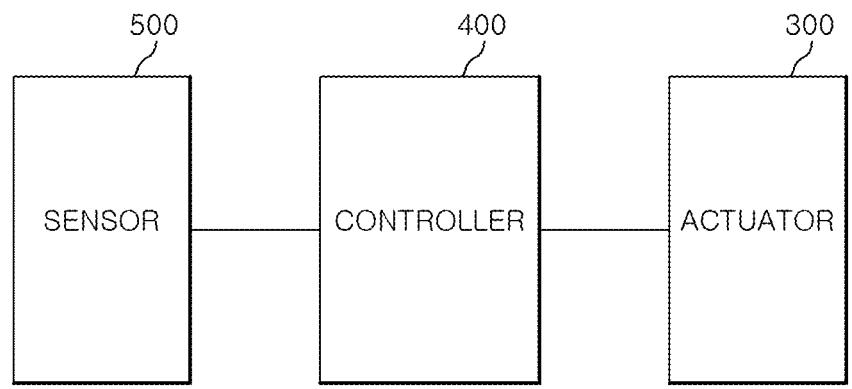
FIG. 15 is a diagram showing a control configuration of the solar energy collector according to a third embodiment.

Hereinafter, with reference to FIG. 15, a solar energy collector according to a third embodiment of the present disclosure will be described.

The solar energy collector according to the third embodiment of the present disclosure includes a solar energy collection tube 100, a lens 200, an actuator 300, a sensor 500 and a controller 400. The configurations of the solar energy collection tube 100, the lens 200 and the actuator 300 except for the sensor 500 and the controller 400 are substantially the same as those of the solar energy collection tube 100, the lens 200 and the actuator 300 of the first embodiment. Therefore, the same configurations will be given the same reference numerals and the redundant description thereof will be omitted.

The sensor 500 can measure the incident angle of solar energy in real time. For example, the sensor 500 may measure the incident angle of the solar energy at predetermined time intervals, and may transmit the angle information on the measured incident angle to the controller 400.

The controller 400 receives the angle information on the measured incident angle of the solar energy from the sensor 500. The controller 400 rotates the solar energy collection tube 100 or the 200 through the actuator 300 so that the solar energy is focused on the solar energy collection tube 100, based on the received angle information.

For example, when the controller 400 receives the angle information on the incident angle of the solar energy from the sensor 500, the controller 400 transmits a drive signal for focusing the solar energy to the solar energy collection tube 100 to the actuator 300. The actuator 300 moves the lens 200 or the solar energy collection tube 100 so that the solar energy is focused on the solar energy collection tube 100, thereby increasing the light collecting efficiency with respect to solar energy.

Figure 16:
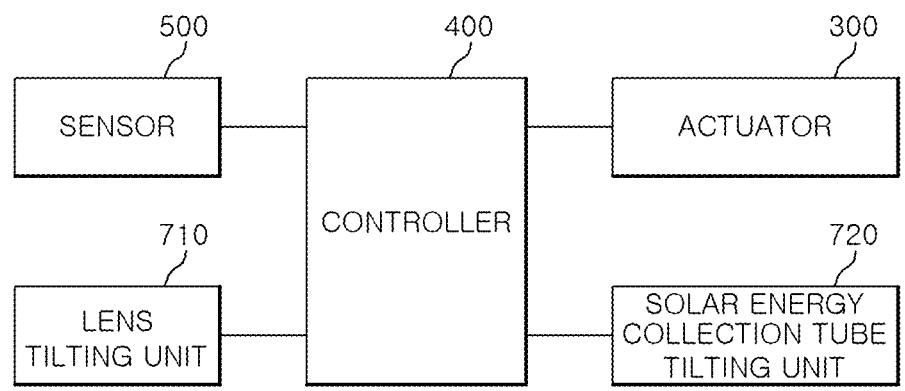
FIG. 16 is a diagram showing a control configuration of the solar energy collector according to a fourth embodiment.

Hereinafter, with reference to FIG. 16, a solar energy collector according to a fourth embodiment of the present disclosure will be described.

The solar energy collector according to the fourth embodiment of the present disclosure includes a solar energy collection tube 100, a lens 200, an actuator 300, a sensor 500, a controller 400, a lens tilting unit 710 and a solar energy collection tube tilting unit 720. The configurations of the solar energy collection tube 100, the lens 200, the actuator 300 and the sensor 500 are substantially the same as those of the solar energy collection tube 100, the lens 200, the actuator 300 and the sensor 500 of the third embodiment. Therefore, the same configurations will be given the same reference numerals and the redundant description thereof will be omitted.

The lens tilting unit 710 can adjust an arrangement angle of the lens 200 so that the lens 200 is disposed to face the direction in which solar energy is incident. The lens tilting unit 710 can be controlled by the controller 400.

For example, when the controller 400 receives the angle information on the incidence angle of the solar energy from the sensor 500, the controller 400 outputs an operation signal for disposing the lens 200 to face the direction in which the solar energy is incident to the lens tilting unit 710. The lens tilting unit 710 adjusts the arrangement angle of the lens 200 under the control of the controller 400 so that the lens 200 can disposed to face the direction in which solar energy is incident.

The solar energy collection tube tilting unit 720 can adjust the arrangement angle of the solar energy collection tube 100 so that the side surface of the solar energy collection tube 100 faces the direction in which the solar energy is incident. The operation of the solar energy collection tube tilting unit 720 is controlled by the controller 400. The manner in which the solar energy collection tube tilting unit 720 is controlled by the controller 400 is the same as the manner in which the lens tilting unit 710 is controlled by the controller 400.

Each of the lens tilting unit 710 and the solar energy collection tube tilting unit 720 includes an operation motor or an operation cylinder capable of applying a rotational force to operation frames (not shown) to which the lens 200 and the solar energy collection tube 100 are respectively mounted. Alternatively, various drive devices, other than the operation motor and the operation cylinder, for rotating the lens 200 or the solar energy collection tube 100 may be used.

In addition, in this embodiment, the lens tilting unit 710 and the solar energy collection tube tilting unit 720 are separately provided to provide a rotational force to the operation frames to which the lens 200 and the solar energy collection tube 100 are respectively mounted. However, the lens tilting unit 710 and the solar energy collection tube tilting unit 720 may be implemented as a single drive unit. For example, the single drive unit performs the functions of the lens tilting unit 710 and the solar energy collection tube tilting unit 720.

According to the embodiments of the present invention, it is possible to effectively collect solar energy through the solar energy collection tube by moving the solar energy collection tube or the lens so that the solar energy is focused on the solar energy collection tube. This makes it possible to stably supply heat required for solar power generation.

Although exemplary embodiments of the present disclosure are described above with reference to the accompanying drawings, those skilled in the art will understand that the present invention may be implemented in various ways without changing the necessary features or the spirit of the present invention. For example, those skilled in the art may change material, size, or the like of the each component depending on an application field, or may combine or substitute the embodiments in a form that is not explicitly disclosed in the embodiments of the present invention, which is not departed from the scope of the present invention. Therefore, it should be understood that the exemplary embodiments described above are not limiting, but only exemplary in all respects, and various modifications should be included the scope and spirit disclosed in the claims of the present invention.

What is claimed is:

1. A solar energy collector, comprising:
   a solar energy collection tube having an absorption medium flow path for allowing an absorption medium to flow therethrough;
   a reflector configured to concentrate solar energy on the solar energy collection tube, wherein the reflector is formed in a curved reflecting surface;
   an actuator configured to move the solar energy collection tube or the reflector based on an incidence angle of the solar energy so that the solar energy is focused on the solar energy collection tube, wherein the actuator is configured to adjust a distance between the solar energy collection tube and the reflector by moving one of the solar energy collection tube and the reflector relative to the other so that a distance between a center of curvature of the reflecting surface and a center of the solar energy collection tube is adjusted such that the distance increases when an incident angle of the solar energy increases, and the distance decreases when the incident angle of the solar energy decreases,
   wherein the actuator is further configured to adjust the distance between the center of curvature of the reflecting surface of the reflector and the center of the solar energy collection tube to focus the solar energy on the solar energy collection tube, and
   wherein the actuator is configured to move the solar energy collection tube toward or away from the reflector along a line perpendicular to a longitudinal axis of the solar energy collection tube and the center of curvature of the reflecting surface of the reflector so that the solar energy is focused on the solar energy collection tube.

2. The solar energy collector of claim 1, further comprising:
   a solar energy collection tube tilting unit configured to adjust an arrangement angle of the solar energy collection tube so that a side surface of the solar energy collection tube is disposed to face an incidence direction of the solar energy.

3. The solar energy collector of claim 1, wherein the lens is configured to concentrate the solar energy toward the center of the solar energy collection tube.

4. The solar energy collector of claim 1, wherein the solar energy collection tube comprises:
   a heat collection body portion including a heat collecting part that transmits the solar energy into the solar energy collection tube; and
   a heat insulating portion provided to cover at least a part of a remaining part of the heat collection body portion other than the heat collecting part.

5. The solar energy collector of claim 1, wherein the solar energy collection tube comprises:
   a heat collection body portion configured to provide the absorption medium flow path, the heat collection body portion having an arc-shaped cross section;
   a heat insulating portion covering the heat collecting portion; and
   a heat collecting window portion connected to the heat collecting portion, the heat collecting window portion transmitting the solar energy therethrough, wherein the heat collecting window portion has an arc-shaped cross section whose radius of curvature is the same as a radius of curvature of the heat collection body portion.

6. The solar energy collector of claim 1, wherein the actuator is configured to move the reflector toward or away from the solar energy collection tube so that the solar energy is focused on the solar energy collection tube.

7. The solar energy collector of claim 1, wherein the actuator comprises:
- a drive arm connected to the solar energy collection tube; and
- a drive cylinder coupled to the drive arm and configured to expand and contract the drive arm so as to move the solar energy collection tube toward or away therefrom.

8. The solar energy collector of claim 1, wherein the actuator comprises:
- a pivot arm connected to the solar energy collection tube; and
- a rotary motor coupled to the pivot arm and configured to rotate the pivot arm so as to move the solar energy collection tube toward or away therefrom.

9. A solar energy collector, comprising:
- a solar energy collection tube having an absorption medium flow path for allowing an absorption medium to flow therethrough, wherein the solar energy collection tube has a center axis which passes through a center of the solar energy collection tube and extends in a longitudinal direction of the solar energy collection tube;
- a lens configured to concentrate solar energy on the solar energy collection tube, wherein the lens has a flat panel shape and extends along the longitudinal direction of the solar energy collection tube;
- a reflector configured to concentrate solar energy on the solar energy collection tube; and
- an actuator configured to move the solar energy collection tube toward or away from the reflector along a line perpendicular to a longitudinal axis of the solar energy collection tube and a center of the reflector so that the solar energy is focused on the solar energy collection tube.

* * * * *